United States Patent
Li et al.

(10) Patent No.: US 9,024,411 B2
(45) Date of Patent: May 5, 2015

(54) CONDUCTOR WITH SUB-LITHOGRAPHIC SELF-ALIGNED 3D CONFINEMENT

(71) Applicant: International Business Machines Corporation, Armonk, NY (US)

(72) Inventors: Junjun Li, Williston, VT (US); Yan Zun Li, LaGrangeville, NY (US); Chengwen Pei, Danbury, CT (US); Pinping Sun, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/964,654

(22) Filed: Aug. 12, 2013

(65) Prior Publication Data

US 2015/0041950 A1   Feb. 12, 2015

(51) Int. Cl.
| H01L 23/52 | (2006.01) |
| H01L 21/44 | (2006.01) |
| H01L 23/525 | (2006.01) |
| H01L 21/768 | (2006.01) |

(52) U.S. Cl.
CPC ...... *H01L 23/5256* (2013.01); *H01L 21/76838* (2013.01)

(58) Field of Classification Search
None
See application file for complete search history.

(56) References Cited

U.S. PATENT DOCUMENTS

| 5,607,878 | A | * | 3/1997 | Otsuka et al. | 438/637 |
| 5,651,857 | A | * | 7/1997 | Cronin et al. | 438/696 |
| 7,651,893 | B2 | | 1/2010 | Chen et al. | |
| 2002/0094631 | A1 | * | 7/2002 | Lee | 438/238 |
| 2003/0230811 | A1 | * | 12/2003 | Kim | 257/758 |
| 2006/0180846 | A1 | * | 8/2006 | Takaishi | 257/314 |
| 2008/0217735 | A1 | | 9/2008 | Chen et al. | |
| 2009/0093100 | A1 | * | 4/2009 | Xia et al. | 438/421 |
| 2010/0109122 | A1 | | 5/2010 | Ding et al. | |
| 2010/0117190 | A1 | | 5/2010 | Chuang et al. | |

\* cited by examiner

*Primary Examiner* — Bilkis Jahan
*Assistant Examiner* — Kevin Quinto
(74) *Attorney, Agent, or Firm* — Catherine Ivers (57) ABSTRACT

A three-dimensionally (3d) confined conductor advantageously used as an electronic fuse and self-aligned methods of forming the same. By non-conformal deposition of a dielectric film over raised structures, a 3d confined tube, which may be sub-lithographic, is formed between the raised structures. Etching holes which intersect the 3d confined region and subsequent metal deposition fills the 3d confined region and forms contacts. When the raised structures are gates, the fuse element may be located at the middle of the line (i.e. in pre-metal dielectric). Other methods for creating the structure are also described.

18 Claims, 13 Drawing Sheets

CONDUCTOR WITH SUB-LITHOGRAPHIC SELF-ALIGNED 3D CONFINEMENT

BACKGROUND OF THE INVENTION

1. Field of the Invention

The present invention generally relates semiconductor structures, and in particular, conductors which may be used as electrical fuses and methods of making the same.

2. Description of Related Art

In the semiconductor industry, fuses are used in integrated circuits (ICs) for improving manufacturing yield or customizing generic integrated circuits. A fuse can be disconnected (known as "blowing a fuse") by passing an electric current or by applying a laser to melt the fuse. A fuse blown by electric current is referred to as an electrical fuse (e-fuse). After blowing the fuse, it is considered programmed.

Programming an e-fuse can occur by passing enough current so that the fuse melts, or passing enough current so that electromigration takes place which either causes an open in the fuse element or increases the resistance.

E-fuses can have one of two orientations, horizontal or vertical. When viewed from top down, a horizontal e-fuse typically includes a line having two wide pad areas at either end with a thinner link in between and connecting the pad areas of the line. The wide pads are to make connections which provide current. Because the current density will be higher at the thin link, the fuse will blow at the thin link. The line is parallel to the substrate, thus a horizontal fuse. A horizontal fuse is typically made of polysilicon and a silicide and found on and in direct contact with the substrate, thus in the front end of line (FEOL) of an IC. However, a horizontal fuse may also be built from other materials and be located in the back end of line (BEOL) wiring levels of an IC. Generally, BEOL is considered to include the first metal level (M1) and above. In either location, the horizontal orientation of the fuse consumes valuable real estate on the chip. Furthermore, as ICs fabrication moves to replacement metal gate processes or FinFET configurations, fabrication of e-fuses in the FEOL becomes difficult to integrate.

A vertical e-fuse is located in the BEOL and when viewed in cross-section includes a top line level, a lower line level and a via connecting the two line levels. The vertical e-fuse is typically designed to blow in the via, but does not always reliably do so. One reason a vertical e-fuse may not reliably blow in the via is because in a dual damascene process there is relatively little resistivity difference between the metal lines and the via. A second reason a vertical e-fuse may not reliably blow in the via is because the larger dimensions of the BEOL (as compared to the FEOL) requires much higher programming current which can cause the fuse to blow away from the desired location.

BRIEF SUMMARY OF THE INVENTION

An object of the invention is to make a conductor which is self-aligned and sub-lithographic.

An object of the invention is to provide an e-fuse structure which provides reliable, low current programming which can be implemented in traditional CMOS configurations (planar gate first), replacement metal gate, or non-planar FETs, and methods for making the same.

An advantage of the present invention is a method of making an e-fuse which is compatible with replacement metal gate and non-planar fabrication.

A further advantage of the present invention is the ability to make a sub-lithographic conductor which may be used as a fuse element.

Another advantage of the present invention is the self-aligned process used to make a conductor which may be used as a fuse element. The self-aligned process uniquely confines the conductor in three dimensions.

An additional advantage of the present invention is that the e-fuse requires low programming current.

Another advantage of the present invention is providing a self-aligned process to make a conductor which uniquely confines the conductor in three dimensions and allows fabrication the conductor feature beyond the limitations of lithography.

Other characteristics and advantages of the invention will become obvious in combination with the description of accompanying drawings, wherein the same number represents the same or similar parts in all figures.

BRIEF DESCRIPTION OF THE DRAWINGS

FIG. 9B" illustrates a cross section in the x-direction of the embodiment of FIG. 9A intersecting the second 3d confined region according to an embodiment of the present invention.

DETAILED DESCRIPTION OF THE INVENTION

The basic invention includes structures having a conductor confined in three dimensions (herein "3d") by a self-aligned process using two raised structures have parallel portions, and the resultant conductor may have at least one dimension below the lithographic limitation. The basic structure will be described generally in conjunction with FIGS. 1A through 1E. Embodiments specific to the particular raised structure will also be described. The invention further includes a method of making a self-aligned three dimensionally confined conductor. The method includes generic, planar replacement gate and non-planar FET embodiments which will be described in conjunction with FIGS. 2-8B. A detailed description of the invention is made in combination with the following embodiments.

Structure
Generic Description

Figure 1A:
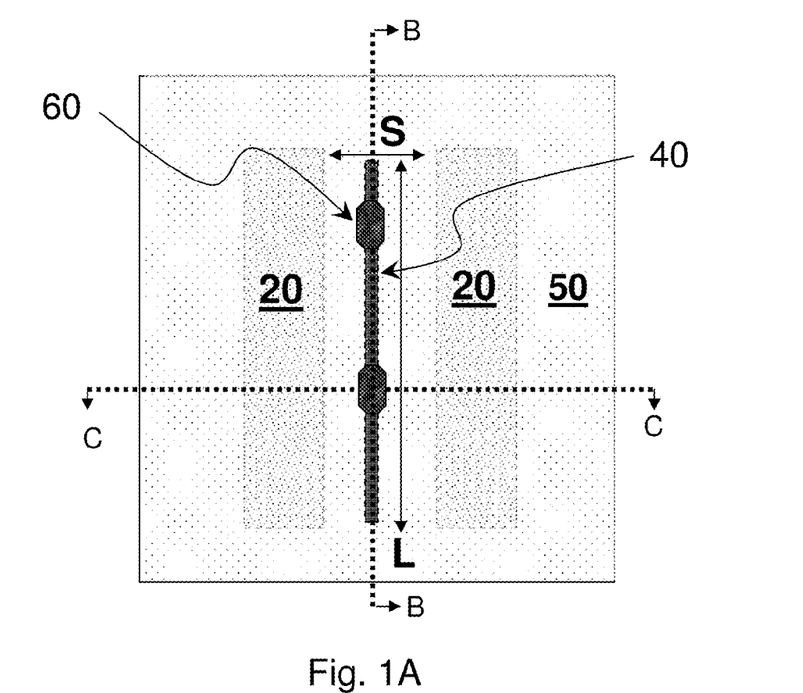
FIG. 1A illustrates a top down view of a substrate having conductor in a 3d confined region and a pair of raised structures according to an embodiment of the present invention.

FIG. 1A illustrates a top down view of a generic embodiment of a substrate having conductor 40 in a 3d confined region and a pair of raised structures 20. The pair of raised structures 20 appears with a dotted outline to indicate they are under a layer 50. Each of the raised structures 20 has a length ($L_x$). The structures may be parallel to each other along at least a portion of their lengths (L) to form a spacing (S) separating the structures. The spacing (S) may be a lithographically define spacing. The spacing will vary with each embodiment, but by way of example, in the spacing S of a gate as a raised structure 20 embodiment, the spacing range may from about 100 nm to about 20 nm and ranges therebetween. Looking from top down, between the raised structures 20 in the spacing (S) is a conductor 40. The conductor 40 is preferably sub-lithographic. In the embodiment shown in FIG. 1A, two contacts 60 are shown intersecting conductor 40. The structure of FIG. 1A may preferably be used as an e-fuse, but is not limited to that function. Materials of the identified features and other raised structure configurations will described later. In FIG. 1A, the dotted line with arrows line B-B indicates a cross-section shown in FIG. 1B. Likewise, the dotted with arrows line C-C indicates a cross-section shown in FIG. 1C.

Figure 1B:
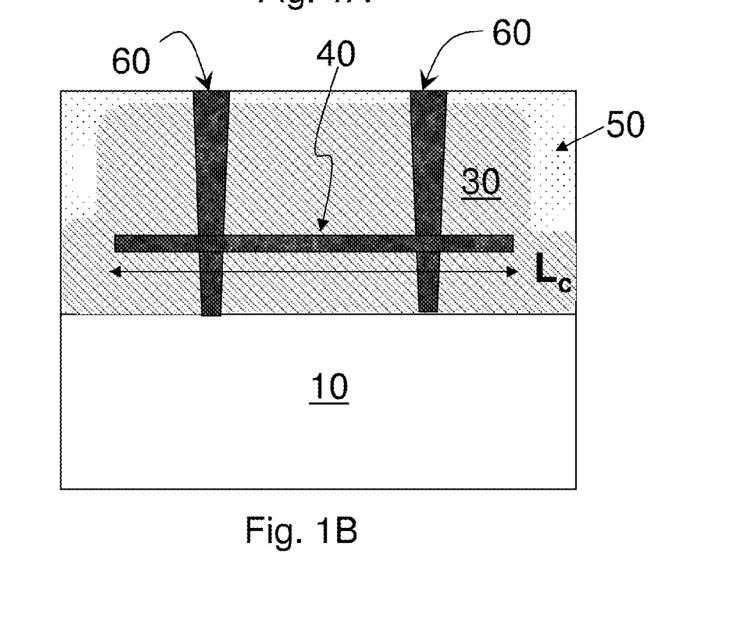
FIG. 1B illustrates a cross-section through the conductor along the B-B line of FIG. 1A parallel to the raised structures according to an embodiment of the present invention.

According to an embodiment of the present invention, FIG. 1B illustrates a cross-section through the conductor along the B-B line of FIG. 1A parallel to the raised structures. Referring to the embodiment illustrated in FIG. 1B, a substrate 10 has above it two dielectric layers, confinement dielectric layer 30 and a second dielectric layer 50. Two dielectric layers are merely one embodiment; there may be more than two layers or a single layer. However, all embodiments will have a dielectric layer which acts as a confinement dielectric layer. As will be explained in more detail when methods of forming the structure are described, a confinement dielectric layer includes the layer in which substantially all of 3d confined region is formed. In the FIG. 1B embodiment, because layer 30 is the confinement dielectric layer, conductor 40 is substantially within layer 30. Conductor 40 has a conductor length ($L_c$).

Still referring to FIG. 1B, one or more contacts 60 may pass through the second dielectric layer 50, confinement dielectric layer 30, conductor 40, and land on substrate 10. Contacts 60 make electrical connection with the conductor 40. The intersection of the contact 60 with the conductor 40 is not at the bottom of the contact 60 (meaning the contact 60 does not land on the conductor 40), nor is the intersection of the contact 60 with the conductor 40 at the top of the contact (meaning the top of the contact 60 and the top of conductor 40 are not co-planar). Instead, the conductor 40/contact 60 intersection point may be anywhere along the height of the contact 60 as long as the top of the contact 60 and conductor 40 are not co-planar, nor is the bottom of the contact 60 and conductor 40 co-planar. In the embodiment shown in FIG. 1B, the intersection point of the contact 60 and conductor 40 is less than one-half the height of the contact 60 and about one third the height of the contact 60. Another interesting feature of the conductor 40/contact 60 intersection point, is that preferably there is no landing pad (meaning wider area) of the conductor 40. Landing pads are usually used in horizontal e-fuses. Instead, preferably, the inventive conductor has the substantially the same width along its length ($L_c$). This inventive configuration is advantageous because it minimizes the real estate needed to create the structure.

Figure 1C:
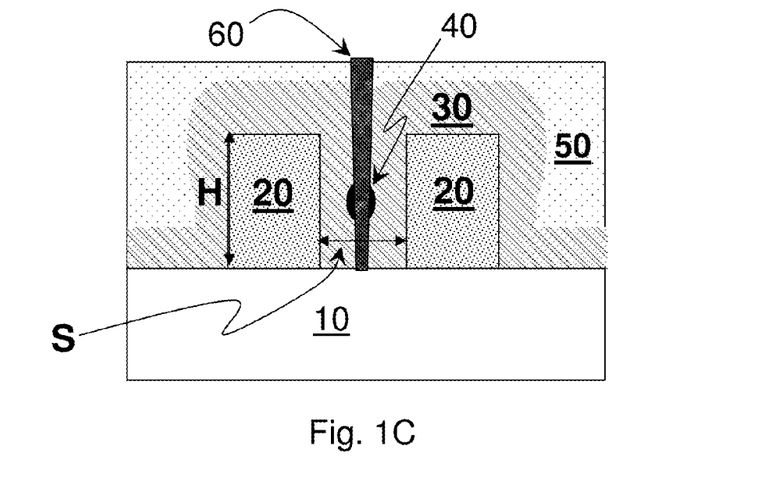
FIG. 1C illustrates a cross-section through the conductor along the C-C line of FIG. 1A perpendicular to the raised structures according to an embodiment of the present invention.

FIG. 1C illustrates a cross-section through the conductor along the C-C line of FIG. 1A perpendicular to the raised structures according to an embodiment of the present invention. The embodiment of FIG. 1C illustrates contact 60 passing through second dielectric layer 50, confinement dielectric layer 30, conductor 40 and landing on the substrate 10. Laterally speaking, the contact 60 and conductor 40 are located between the spacing (S) of the pair of raised structures 20. Vertically speaking, the intersection of the contact 60 and conductor 40 is within the height (H) of the raised structures 20 according to the embodiment illustrated in FIG. 1C. Preferably, the conductor 40 is located so as to be substantially within the height (H) of the raise structures 20, but depending upon the aspect ratio of the height (H) and spacing (S), and the dielectric layer(s) deposition conditions, the conductor 40 may be substantially above or above the height (H) of the raised structure 20.

Regardless of vertical location, the conductor 40 may be substantially confined in three dimensions (height, width, and length of the conductor) by the confinement dielectric 30. This means that the conductor may be substantially surrounded on all sides (except for intersection with contacts 60) by the same dielectric layer. Here, same dielectric refers to not only the same material, but the material is ideally deposited by a single deposition. This envelopment of the conductor by the same dielectric is in contrast to most conductor structures in which the conductor may be embedded in a dielectric material such that a cross-section shows three sides of the conductor are surrounded by the same dielectric layer, but an additional dielectric layer deposition is needed to confine the top of the conductor (for example, a typical dual damascene or a metal RIE structure).

Regardless of vertical location, the conductor 40 may be substantially confined in three dimensions (height, width, and length of the conductor) by the confinement dielectric 30. Because the spacing S between the two raised structures 20 is limited by the minimum size allowed by lithographic technology, by further confinement with dielectric 30, the resultant conductor dimension—height or width or both is substantially less than S. This means that a sub-lithographic conductor could be fabricated by present invention. Furthermore, the sub-lithographic conductor is self-aligned in the spacing S between the raised structures 20.

Also in contrast to most horizontal conductors, the conductor 40 of the present invention is not rectangular when viewed in cross-section. Instead, conductor 40 may be oval, triangular, rain-drop shaped or other non-rectangular shapes (for example, see FIGS. 4C and 4D which show images of the 3d confined region 70 which is eventually filled with conductor 40). The width of conductor 40 will vary with spacing S of the raised structures 20, the thickness of dielectric layer(s), and the detailed process of dielectric deposition such as temperature and other deposition parameters. Preferably, though not necessarily, the width of the conductor 40 at the widest point is sub-lithographic i.e. dimension less than whatever current lithographic technology allows. As an example, for 20 nm node technology embodiment in which the raised structure 20 is a gate line, the raised structure could be about 20 nm wide while the conductor 40 made in accordance with this invention could be as narrow as 10 nm or even less, which less than the current lithographic technology would be able to print. Therefore, the width of the conductor 40 may be from about 50 nm to about 10 nm or even below and ranges therebetween. Referring to FIGS. 4C and 4D again, the width of the 3d confined region 70 (and thus the width of the conductor 40) is about 15 nm. Preferably, conductor 40 is a fuse element, thus the preferred sub-lithographic dimensions greatly aid in blowing the fuse because the element will have a high current density.

Figure 1D:
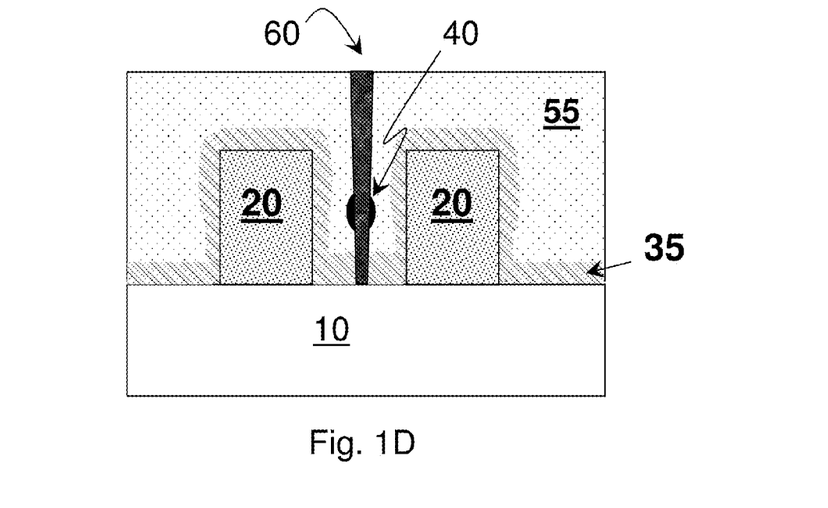
FIG. 1D illustrates a cross-section through the conductor along the C-C line of FIG. 1A perpendicular to the raised structures according to another embodiment of the present invention.

FIG. 1D illustrates a cross-section through the conductor along the C-C line of FIG. 1A perpendicular to the raised structures according to another embodiment of the present invention. In the FIG. 1D embodiment there are also two dielectric layers, however, the first dielectric layer 35 is not the confinement dielectric layer, instead the second dielectric layer 55 is the confinement dielectric layer. Thus, the point is that in a multi-layer dielectric embodiment, the confinement dielectric layer can be any of the dielectric layers, it does not have to be the first dielectric layer deposited. Thus, there may be no restriction as to order of dielectric deposition and whether or not the layer is the confinement dielectric layer.

In addition to order of deposition, conformality of the dielectric layer may have no restriction as to whether the layer the confinement dielectric. Conformality refers to the thickness of a film over a non-planar surface. If the film has substantially the same thickness over all surfaces of a non-planar surface, it is conformal. If the film thickness varies with the location on surface as layer 35 does in FIG. 1D, then the film may be non-conformal. Generally, speaking to create the 3d confined region which becomes conductor 40, a non-conformal deposition may be required somewhere in the process. Here, in FIG. 1D, the first dielectric layer 35 is non-conformal and the conformality of confinement dielectric 55 cannot be determined by this rendering. However, both layers can be non-conformal or a single layer can be non-conformal, Furthermore, it may not be necessary that the confinement layer be non-conformal as long as a prior layer is non-conformal (which may or may not be a dielectric) or the sidewalls of the raised structures 20 have a re-entrant geometry with respect to the spacing (S). With such a re-entrant geometry, the width of the spacing at the top of the raised structure will by small than the width of the spacing at the bottom of the raised structures. With a re-entrant geometry, a non-conformal dielectric deposition may not be necessary.

Figure 1E:
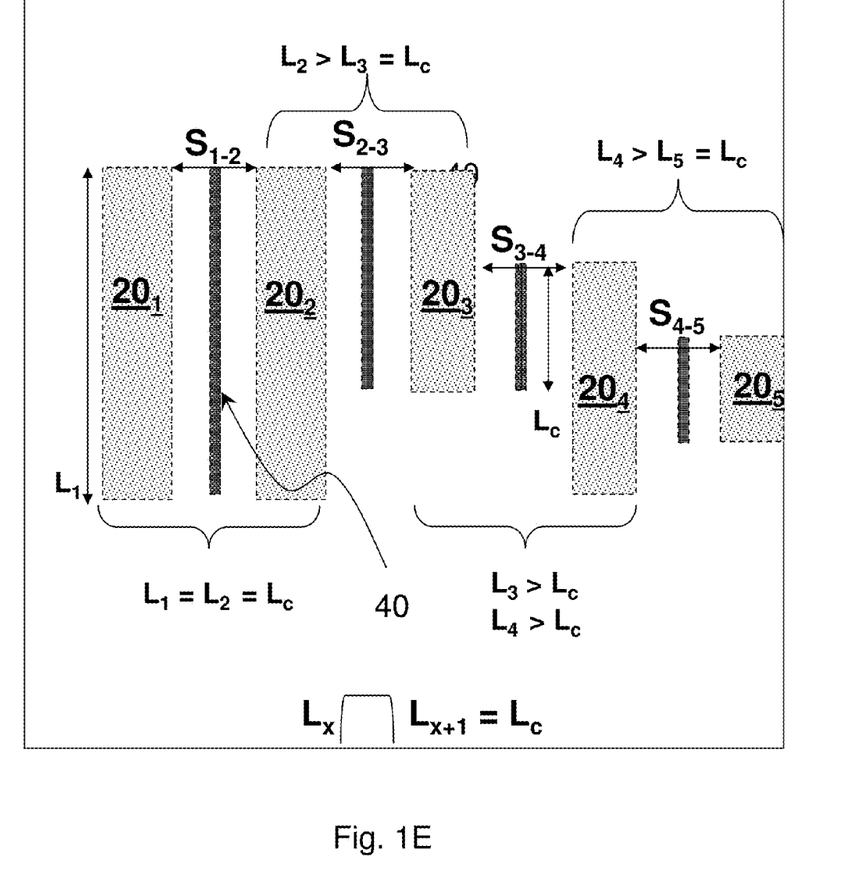
FIG. 1E is a top down view of a several raised structure sets illustrating the relationship among raised structure configurations and conductor length according to some embodiments of the present invention.

Referring to FIG. 1E, a variety of raised structure 20 paring configurations are illustrated. The point of this figure is to show how the length of each raised structure 20, and the starting and endpoints of each raised structure 20 determines the location of the spacing (S) between the raised structures 20 and thus the conductor length ($L_c$). Where the length of parallel raised structures overlap (are coincident) a spacing S is formed which becomes the conductor length. Mathematically speaking, then, the conductor length ($L_c$) is equal to the intersection of the first raised structure length and the adjacent/second raised structure length ($L_x \cap L_{x+1} = L_c$). FIG. 1E illustrates several, non-limiting examples. Starting from the right of FIG. 1E, the raised structures lengths ($L_1$ and $L_2$) may coincide completely with respect to both raised structures, meaning each raised structure 20 has the same length (L) which stop and start the same point. Thus, with complete coincidence, the conductor 40 has a length (Lc) which is about equal to the length (L) of the raised structures 20. Moving to the second set of raised structures, second raised structure $20_2$ having a length ($L_2$) and third raised structure $20_3$ having a length ($L_3$) start at the same point, but third raised structure $20_3$ is shorter than second raised structure $20_2$, thus, $L_2 > L_3$. Here, there is complete coincidence only with respect to the third raised structure $20_3$, meaning the entire length ($L_3$) of the third raised structure $20_3$ overlaps with the second raised structure $20_2$ but not vice verse. Accordingly, with complete coincidence with respect to only one raised structure, the conductor length ($L_c$) is equal the length of the shorter raised structure, thus, in this case $L_2 > L_3 = L_c$. Moving to the third set of raised structures, third raised structure $20_3$ having a length ($L_3$) and fourth raised structure $20_4$ having a length ($L_4$) start and end at different points, and have partial coincidence with respect to both raised structures. In the case of partial coincidence of both raised structures, the length of each raised is immaterial with respect to conductor length ($L_c$), but the conductor length will always be less than each of the raised structure lengths, thus, $L_c < L_3$ and $L_c < L_4$. Moving to the fourth set of raised structures, fourth raised structure $20_4$ having a length ($L_4$) and fifth raised structure $20_5$ having a length ($L_5$) start and end at different points but unlike the previous example the fifth raised structure $20_5$ starts and ends within the length ($L_4$) of the fourth structure $20_4$, thus there is complete coincidence with respect to one raised structure, namely the fifth structure $20_5$. Thus, the conductor length ($L_c$) is equal the length of the shorter raised structure, thus, in this case $L_4 > L_5 = L_c$.

This concludes the generic description of the structure, now materials used and specific embodiments will be discussed.

General Materials and Gate as Raised Structure Embodiment

In a preferred embodiment, the raised structures 20 are gates above a substrate 10. The gate may be made by gate first process or a replacement gate process. The gate may be part of a planar field effect transistor (FET) or a non-planar FET, such as a finFET. Generically speaking, substrate 10 may include the entire underlying base from which the raised structures are supported. In the gate as raised structure embodiment, the substrate 10 may include a bulk semiconductor substrate or a silicon on insulator substrate.

Generally, speaking the dielectric layer(s) (whether the confinement dielectric layer or others in a stack) over the raised structure may include silicon oxides, doped silicon oxides, silicon oxynitrides, silicon nitrides, organic dielectrics, porous dielectrics or other dielectric materials. In the gate as raised structure embodiment, preferably there is a multilayer stack of dielectrics including a silicon oxide or doped silicon oxide, and a silicon nitride. Even more preferably the silicon oxide or doped silicon oxide layer may be the dielectric confinement layer 30 and the silicon nitride may be dielectric layer 50. Generally speaking, dopants of the doped silicon oxide may include one or more of fluorine, boron, phosphorus, carbon, and other elements. In the gate as raised structure embodiment, the preferred dopants may be boron and phosphorus.

Generally speaking, the conductor 40 may be one or metals preferably deposited by chemical vapor deposition, plasma enhanced chemical vapor deposition, atomic layer deposition or any other suitable means. In the gate as raised structure embodiment, the conductor 40 may preferably include a titanium layer, titanium nitride layer and a tungsten layer. Preferably, the titanium and titanium nitride layers hug the walls of the confinement dielectric while the tungsten fills the bulk of the conductor space. Generally, speaking the contact 60 may be the same material as the conductor 40. Therefore, in preferred embodiment of the gate as raised structure, the contacts with be substantially tungsten with a titanium/titanium nitride liner. Other embodiments contemplate the use of other materials as the conductor 40, by way of example but not limitation, copper, aluminum, platinum could also be used as part of the conductor 40.

The gate itself may include one or more of the following a gate dielectric, a work function metal and a "metal" portion. In some embodiments the gate may include silicon oxide as the gate dielectric and polysilicon as the "metal" portion. In other embodiments the gate dielectric may include one or more of the following (by way of illustration and not limitation) silicon oxide, silicon oxynitride, hafnium oxide, and hafnium silicon oxide. In some embodiments the work function metal may include one or more of Al/O and La/O, by way of example and not limitation. In some embodiments the "metal" may include one or more of Ti/N and Ti/O.

Fin as Raised Structure

In another embodiment the raised structures 20 may be fins of a FinFET. In the fin embodiment, the fin raised structure 20 is preferably made of silicon but may be other semiconducting materials. The substrate 10 may include the same material as the fin, silicon, oxide or a combination of the foregoing materials. In the fin embodiment, dielectric layers including confinement dielectrics are the same as those generally described in the preceding paragraph. In the fin embodiment, contact and conductor materials are the same as those generally described in the preceding paragraph, and preferably are the same as those described in the preferred embodiment of the preceding paragraph.

Figure 9A:
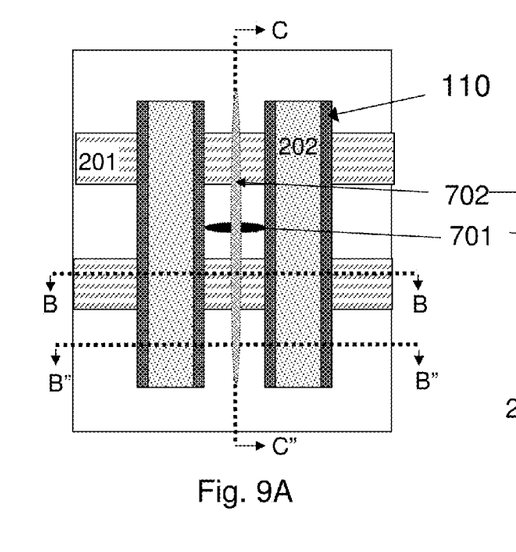
FIG. 9A illustrates a top down view of a structure having two 3d confined regions according to one embodiment of the present invention.
Figure 9B:
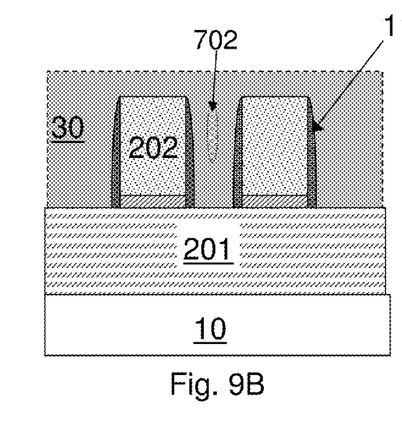
FIG. 9B illustrates a cross section in the x-direction of the embodiment of FIG. 9A along the first raised structure and intersecting the second 3d confined region according to an embodiment of the present invention.
Figure 9C:
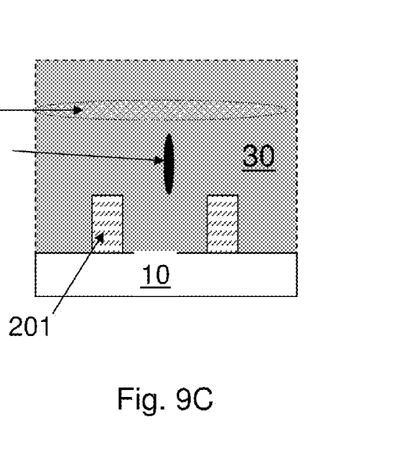
FIG. 9C illustrates a cross section in the y-direction of the embodiment of FIG. 9A along the spacing created by the pair of second raised structure and intersecting the first and second 3d confined region according to an embodiment of the present invention.

A finFET provides an opportunity for a unique structure wherein there may be two confined region running perpendicular to each other. This can occur because there may be two different raised structures, the first pair of raised structures 201 comprising the fins and the second pair of raised structures 202 comprising the gates as seen in FIGS. 9A-9C. The spacing between the fins (first raised structures 201) may create a first 3d confined region 701 running parallel to the fins. The spacing between the gates (second raised structures 202) may create a second 3d confined region 702 running parallel to the gates. Because in the finFET embodiment the first and second raised structures (fins and gates respectively) run perpendicular to each other, so do the first and second 3d confined regions. In a preferred embodiment shown in FIGS. 9A-C, the first and second 3d confined regions do not intersect each other. However, it is possible from confinement layer(s) 30 such that first and second 3d confined regions (701 and 702) do intersect.

Metal RIE as Raised Structure

In yet another embodiment the raised structures are metal features, for example metal interconnects, studs or pads. Preferably, the metal raised structures are formed by reactive ion etching. In the metal raised structure embodiment, the metal raised structure 20 preferably comprises aluminum but may be other conducting materials. The substrate 10 may include underlying materials upon which the metal rests. In the metal embodiment, dielectric layer(s) including the confinement dielectric may be the same as those generally described earlier, but in a preferred embodiment of the metal raised structure the dielectric confinement layer 30 may be silicon oxide with an overlying silicon nitride or carbon based dielectric layer 50. In the metal raised structure embodiment, contact and conductor materials are the same as those generally described in the preceding paragraphs.

Methods

In the gate as raised structure embodiment, the width of the gates and spacing between gates will vary with each technology node. For example, for a 32 nm node technology, the gate width will be about 32 nm and the spacing S between adjacent gates may be about 100 nm or less when spacers are factored in. For a 22 nm node technology node the spacing is about 70 nm or less when spacers are factored in. Examples of spacing S with gates 20 having spacers is shown in FIGS. 4C and D. Referring to FIGS. 4C and D, gates are the raised structures 20 on a substrate 10. The gates have spacers (dielectric on the gate sidewalls but not lining the substrate) and spacing S. Here, the spacing is about 70 nm. The height of the spacing opening is indicated by H. Thus, an aspect ratio about great than one is formed.

Figure 4A:
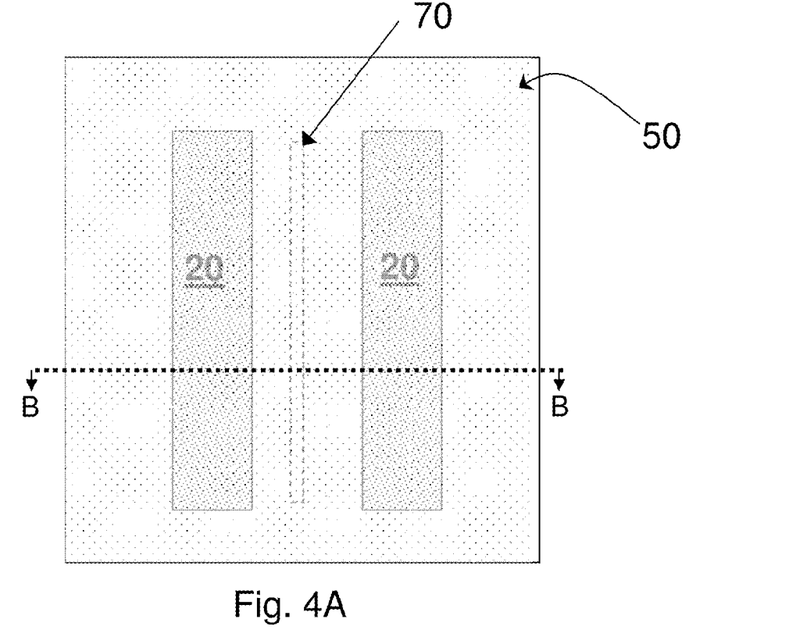
FIG. 4A illustrates a top down view of a substrate having a non-conformal dielectric deposition forming a three-dimensional confined feature according to one embodiment of the present invention.
Figure 4B:
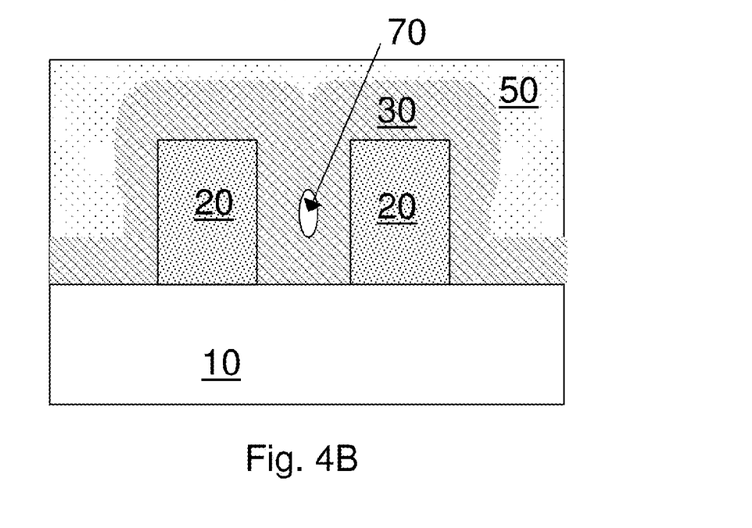
FIG. 4B illustrates a cross section in the x-direction of FIG. 4A according to one embodiment of the present invention.
Figure 4C:
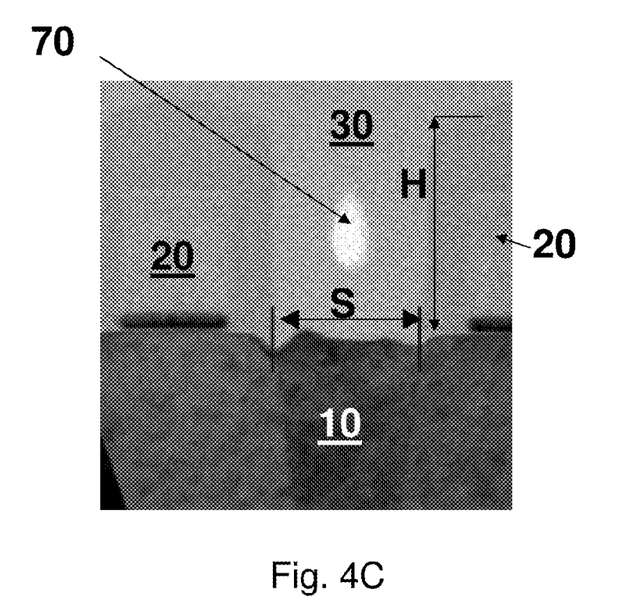
FIG. 4C is an image showing a confinement region according to an embodiment of the present invention.
Figure 4D:
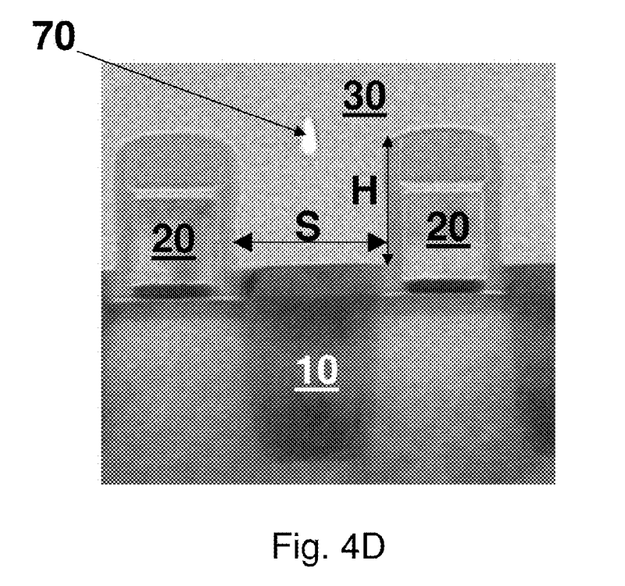
FIG. 4D is an image showing a confinement region according to an embodiment of the present invention.

Referring to FIGS. 4A and 4B, step 110 of creating a creating a self-aligned, 3d confined conductor according to a generic embodiment includes depositing one or more dielectric layers to form a dielectric layer having a 3d confined region, i.e. forming a confinement dielectric. Referring to the embodiment in FIG. 4B confinement dielectric 30 is deposited non-conformally over the raised structures 20. Due to the non-conformal deposition a void or 3d confined region 70 is formed in the confinement dielectric 30. A non-conformal film is one in which the film thickness is not uniform over a non-planar surface. For example, in the embodiment in FIG. 4B, the thickness of film 30 on the sidewalls of is thinner near the bottom of the sidewall and thicker near the top. A non-conformal film may be deposited by a plasma enhanced chemical vapor deposition (PECVD) process. The degree of non-conformality can be somewhat adjusted by manipulating process parameters, for example, increasing pressure, decreasing temperature and decreasing substrate bias may increase the degree of non-conformality. While PECVD is the preferred deposition method, other methods, for example and not be way of limitation, chemical vapor deposition (CVD), or ALD may be used. As previously explained, a confined region may be formed by deposition of dielectric layer(s) either conformally or non-conformally in an opening having a re-entrant profile.

Continuing with the FIG. 4B embodiment, another dielectric layer 50 may be deposited. In this embodiment, the another dielectric layer 50 is deposited (preferably by PECVD) and is planarized (preferably by chemical mechanical polishing). In other embodiments, the another dielectric layer 50 may be a spin on dielectric such that a separate planarization process is not required.

Referring to the specific samples shown in the images of FIGS. 4C and D, the 3d confined region 70 has void height around 25 nm and a void width of about less than 15 nm. The confined region will be filled with a conductor in a subsequent step to become the conductor 40 having the same dimensions as the 3d confined region 70.

Figure 5A:
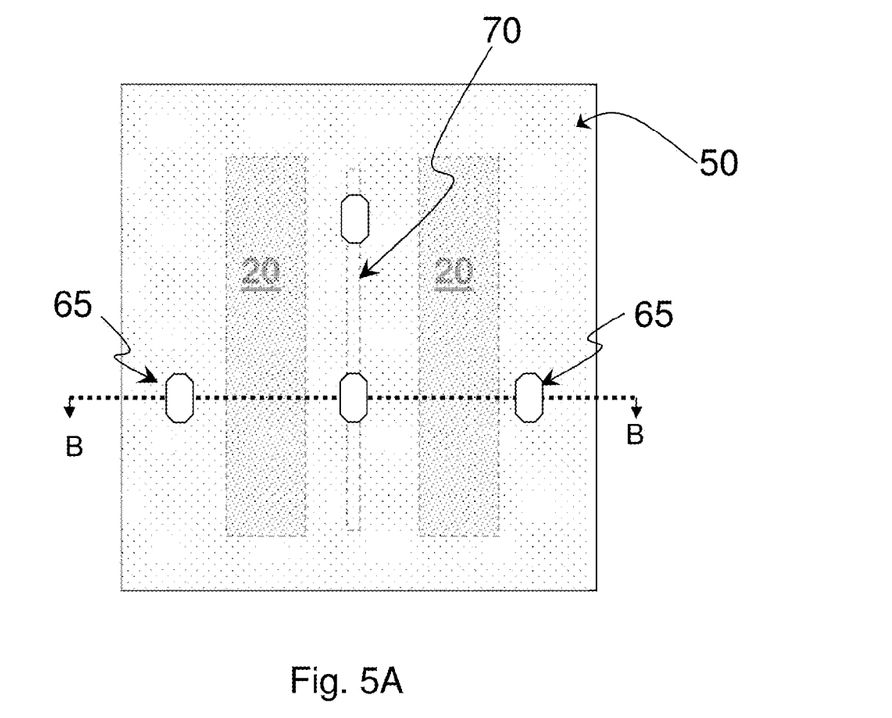
FIG. 5A illustrates a top down view of a substrate having a contact opening intersecting the 3d confined region according to one embodiment of the present invention.
Figure 5B:
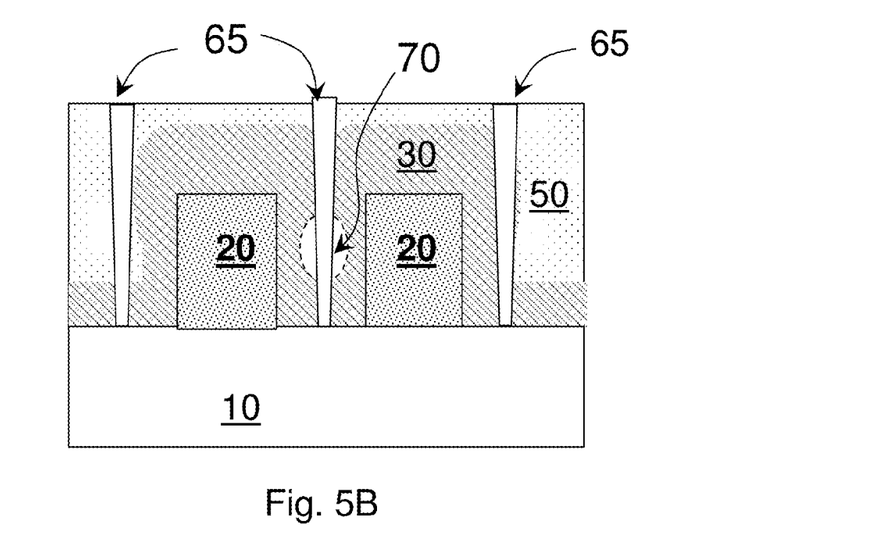
FIG. 5B illustrates a cross section in the x-direction of FIG. 4A according to one embodiment.

Referring to FIGS. 5A and 5B, step 120 of creating a self-aligned, 3d confined conductor according to the first embodiment include etching the dielectric stack to form a contact opening which intersects the 3d confined region 70. Referring to the embodiment of FIG. 4A, a top down of the structure after etching contact openings 65 is show. The figures show the preferred alignment of the contact opening 65 bisecting the 3d confined region 70, however, some misalignment is expected. The two features only have to intersect enough to allow the subsequently deposited metal to reach the 3d confined region 70. The figures show the 3d confined region 70 having a width greater than the contact opening 65. However, the opposite may also be true and in a preferred embodiment, is true.

Figure 6A:
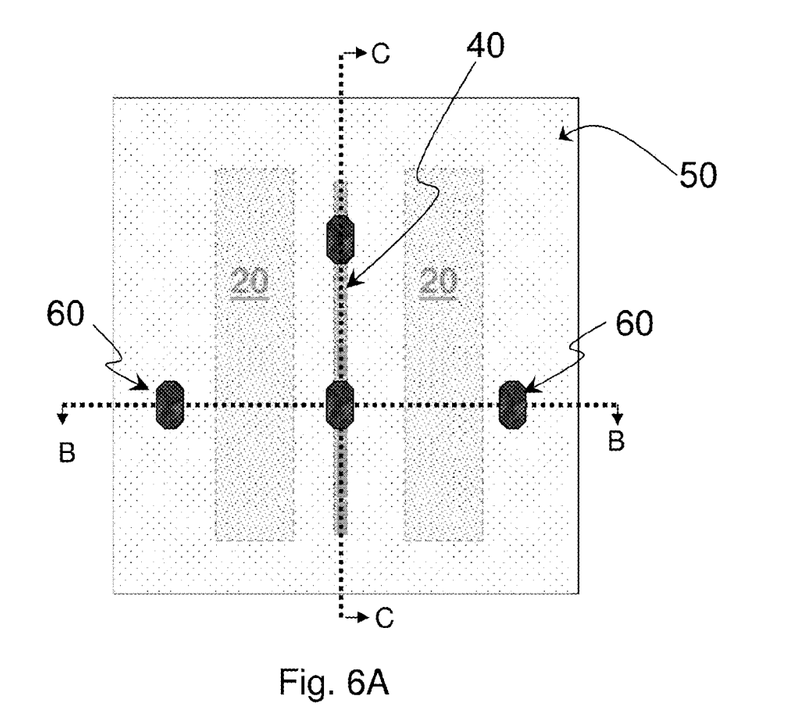
FIG. 6A illustrates a top down view of a substrate having contacts and a three-dimensional confined fuse feature according to one embodiment.
Figure 6B:
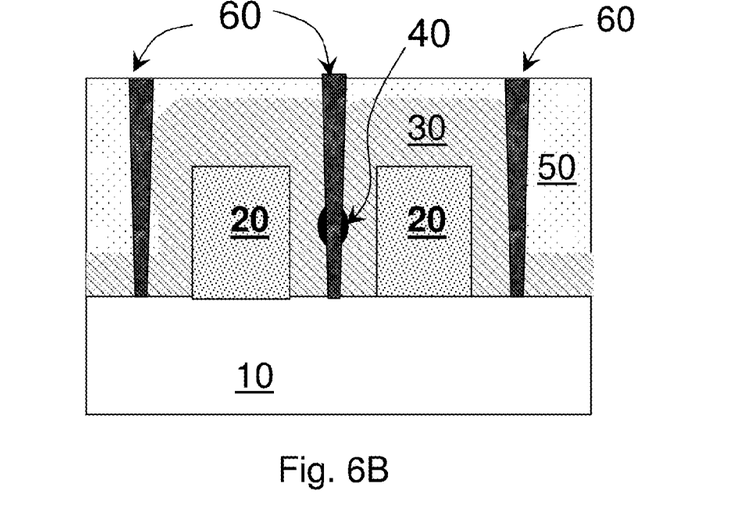
FIG. 6B illustrates a cross section in the x-direction of FIG. 6A of a substrate having contacts and a three-dimensional confined conductor according to one embodiment.
Figure 6C:
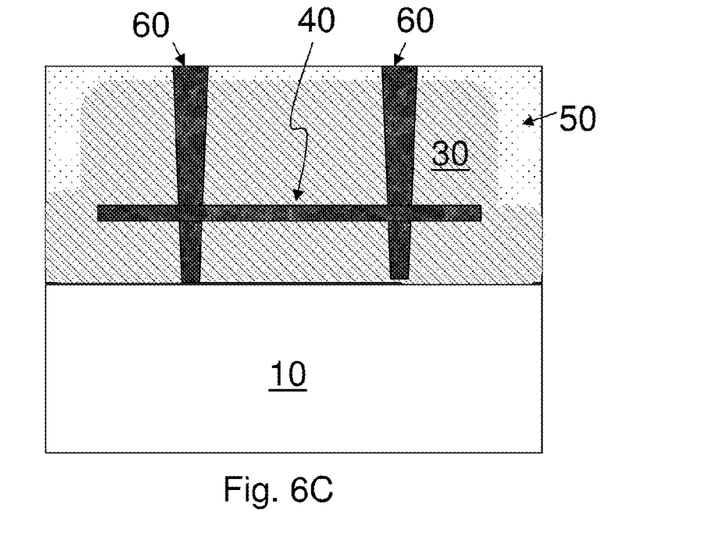
FIG. 6C illustrates a cross section in the y-direction of FIG. 6A of a substrate having contacts and a three-dimensional confined conductor according to one embodiment.

Referring to FIGS. 6A through C, step 130 of creating a self-aligned, 3d confined conductor according to the first embodiment includes depositing a metal within the 3d confined region. The metal is deposited by any means which may fill the 3d confined region to form conductor 40. A preferred method is by CVD. Appropriate metals include those which may be deposited by CVD. An example of such metals include titanium, titanium nitride, and tungsten. While the word "metal" is used, one or more conducting layers may be used, preferably, the titanium and titanium nitride layers hug the walls of the confinement dielectric while the tungsten fills the bulk of the conductor space. During the metal deposition process, because the contact opening intersects the confined region, both the opening and confined region may filled with metal thus forming conductor 40 and contacts 60. Thus, in a preferred embodiment the contact 60 may be the same material as the conductor 40.

The embodiments of FIGS. 6B and C show the contacts 60 are substantially co-planar with the top dielectric surface, dielectric layer 50 in this embodiment. Referring the to figures, the contacts 60 land on the substrate which in the case of the gate or fin as raised structure 20 embodiment may mean that the contacts 60 land on an active area of the device.

Figure 2:
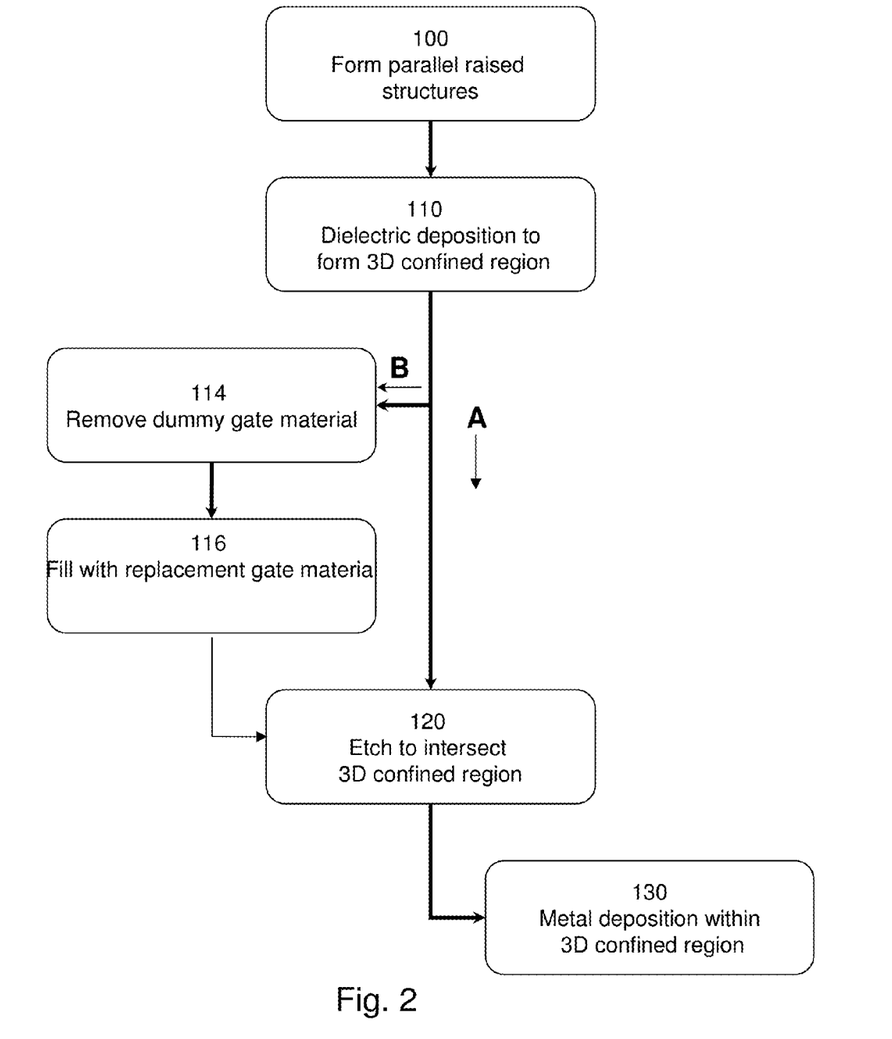
FIG. 2 is a flow chart with the steps of creating a self-aligned, three dimensionally (3d) confined conductor according to a generic embodiment and a replacement gate embodiment
Figure 3A:
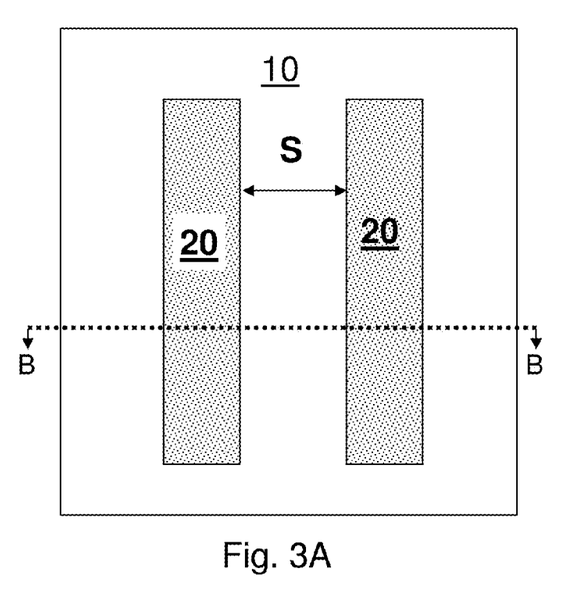
FIG. 3A illustrates a top down view of a substrate having raised structures according to one embodiment of the present invention.
Figure 3B:
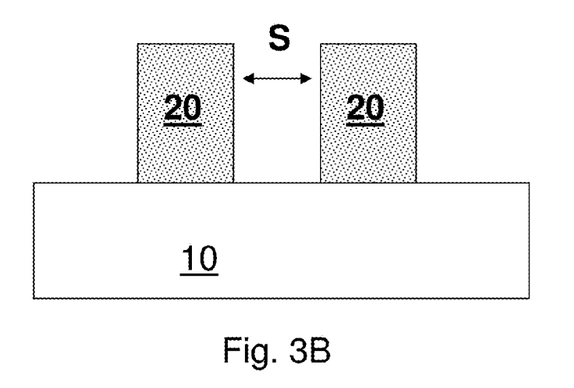
FIG. 3B illustrates a cross section in the x-direction of FIG. 3A according to one embodiment of the present invention.

This concludes the description of making a sub-lithographic (preferably), self-aligned 3d confined conductor according to the first method embodiment (path A of FIG. 2). A method of making an embodiment of the sub-lithographic (preferably) 3d confined conductor wherein the raised structure is a replacement gate is describe below with reference to FIGS. 2, 7A and 7B.

Figure 7A:
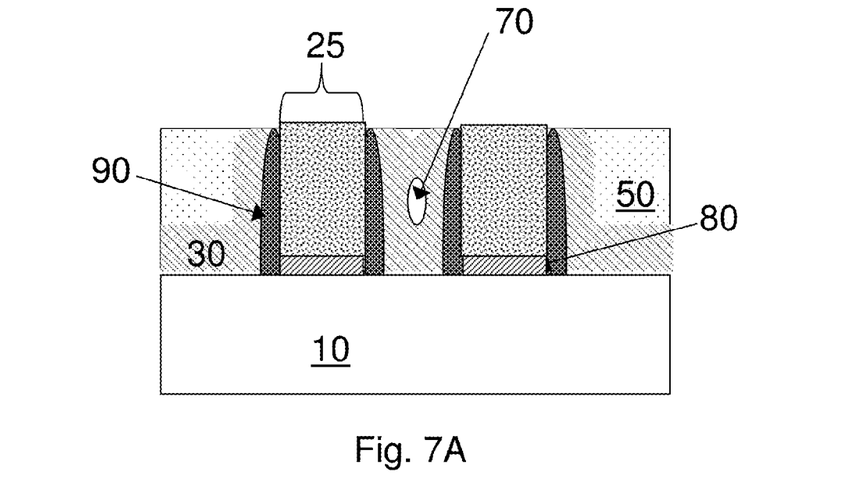
FIG. 7A illustrates a cross section in the x-direction of a substrate according to a step in the replacement embodiment in which overlying dielectric layer(s) have been removed to form a co-planar dielectric layer(s) dummy material structure.
Figure 7B:
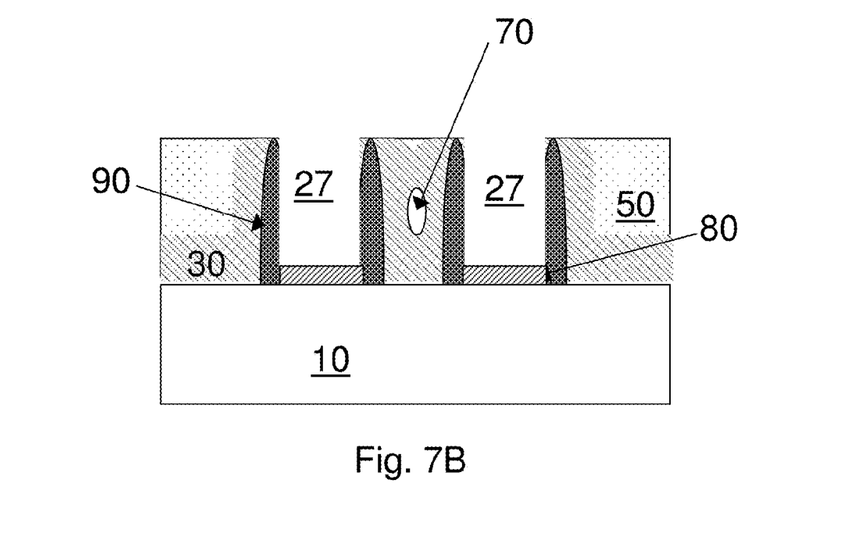
FIG. 7B illustrates a cross section in the x-direction of a substrate according to a step in the replacement embodiment in which dummy material has been removed forming a dummy opening.

Referring to the flow chart in FIG. 2, after step 110, path B includes step 114 removing dummy gate material. Referring to FIG. 7A, a cross-section of an embodiment of a replacement gate method is shown as it would appear after step 110 and removing any overlying dielectric material by etching or preferably by polishing to form a dummy gate co-planar with the surrounding dielectric layer(s). Here, a dummy gate may include a gate interfacial layer 80 which may optionally also include a gate dielectric, one or more spacers 90 and dummy material 25. The interfacial layer preferably may be a nitrogen containing oxide. Referring to FIG. 7B, the dummy material 25 such as polysilicon is removed by a wet etch or RIE to form a replacement gate opening 27. The dummy material 25 may be removed using a mixture of HBr or HCl and $Cl_2$ and one or more ballast gases.

Figure 8A:
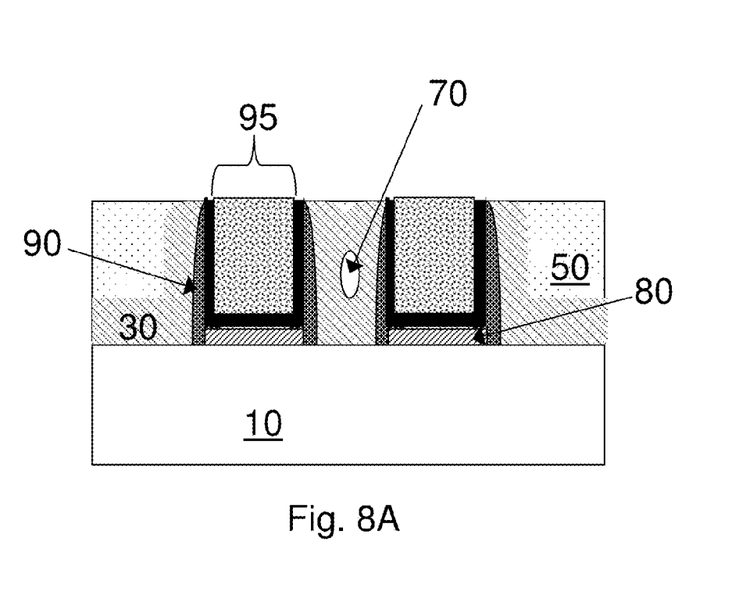
FIG. 8A illustrates a cross section in the x-direction of a substrate according to a step in the replacement embodiment in which replacement material fills the dummy opening and is planarized.

Referring to FIG. 8A, step 116 of the replacement method embodiment includes filling the replacement gate opening 27 with replacement materials. The replacement materials 95 may include one or more gate materials, preferably metal gate materials each which may line or fill the opening. Preferably, the replacement materials are high-k metal gate compatible materials such as hafnium oxide, aluminum oxide, lanthanum oxide and titanium nitride, for example. Please note, these materials may be the same as those described earlier in conjunction with the gate as raised structure embodiment. The replacement gate materials are deposited and planarized to form the structure shown in FIG. 8A.

Figure 8B:
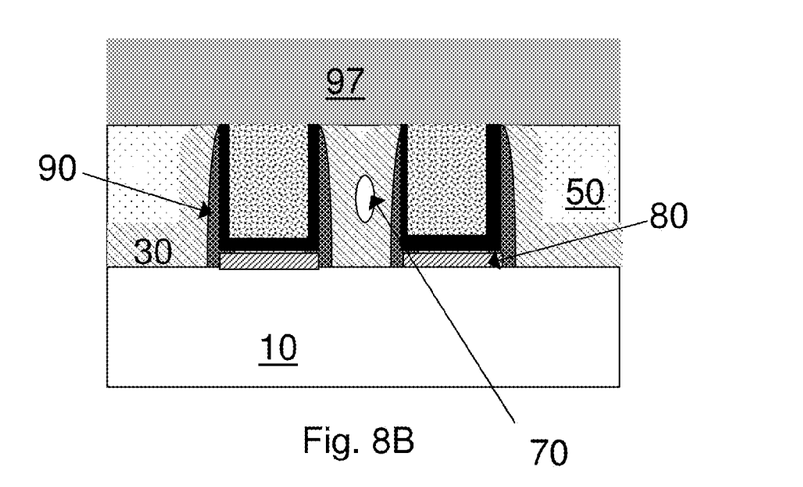
FIG. 8B illustrates a cross section in the x-direction of a substrate according to a step in the replacement embodiment in which a top dielectric layer is above the co-planar replacement material and dielectric layer(s)

Referring to FIG. 8B, preferably, a top dielectric layer 97 is formed over the planarized replacement gate prior to rejoining path A of FIG. 2 and continuing to step 120. The top dielectric may be any dielectric deposited by any means and may preferably include at least one of silicon nitride or silicon oxide which is/are preferably formed by PECVD.

This concludes the description of self-aligned 3d confined conductors with preferably sub-lithographic width and methods to make the same. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. A structure comprising:
    a pair of raised structures each having a length wherein the pair of raised structures run parallel to each other for a least a portion of their respective lengths;
    a spacing separating the pair of raised structures;
    a dielectric film forming a 3d confined region wherein the 3d confined region is at least partially in the spacing separating the pair of raised structures;
    a conductor within the 3d confined region;
    a contact; and
    an intersection point of the contact and the conductor wherein the intersection point is above a bottom of the contact and below a top of the contact such that the conductor is not co-planar with the bottom of the contact and not co-planar with the top of the contact.

2. The structure of claim 1 wherein the pair of raised structures is selected from the group consisting of fins, gates, and metal reactive ion etched (RIE) structures.

3. The structure of claim 1 wherein the 3d confined region is sub-lithographic.

4. The structure of claim 1 wherein the 3d confined region has a width less than a width of the raised structure.

5. The structure of claim 1 wherein the 3d confined region has a lower width greater than an upper width and wherein the lower width is less than 40 nm.

6. The structure of claim 1 wherein a length of the 3d confined region is from about 1000 nm to about 30 nm.

7. The structure of claim 1 wherein a height of the 3d confined region is from about 100 nm to about 10 nm.

8. The structure of claim 1 wherein the dielectric film forming the 3d confined region is non-conformal over the pair of raised structures.

9. The structure of claim 1 wherein the dielectric film comprises one or more dielectric film layers selected from the group consisting of silicon nitride, silicon dioxide, doped silicon oxides, porous dielectrics, carbon based dielectrics, and polymeric dielectrics.

10. The structure of claim 1 wherein the conductor comprises tungsten.

11. The structure of claim 1 wherein the spacing creates a high aspect ratio opening.

12. The method of forming a conductive structure comprising:
    forming a pair of raised structures separated by a spacing;
    depositing a dielectric layer over the pair of raised structures thereby forming a 3d confined region within the dielectric and within the spacing;
    forming an opening which intersect the 3d confined region;
    filling the opening and the 3d confined region with metal;
    planarizing the dielectric layer to be co-planar with the pair of raised structures;
    removing at least a portion of the raised structure leaving a raised structure opening; and
    forming one or more films in the raised structure opening.

13. The method of claim 12 further comprising:
    planarizing at least one film in the raised structure opening; and
    forming a top dielectric layer over the refilled raised structure.

14. The method of claim 12 wherein forming a 3d confined region forms a 3d confined region having a sub-lithographic width.

15. The method of forming an electronic fuse, the method comprising:
    depositing a dielectric layer over a pair of gate structures to form a tube along a portion of a length of one of the gate structures;
    forming a hole in the dielectric which intersects a portion of the tube; and
    filling the hole and the tube with a metal.

16. The method of claim 15 wherein the pair of gate structure have retrograde sidewalls relative to a spacing between the pair of gate structures.

17. The method of claim 15 wherein the dielectric layer is deposited in a non-conformal manner.

18. The method of claim 15 wherein the tube is less than about 20 nm in width.

* * * * *